US010288231B2

(12) United States Patent
Rieder et al.

(10) Patent No.: US 10,288,231 B2
(45) Date of Patent: May 14, 2019

(54) NON-ETCHED WIRING BOARD FOR LED APPLICATIONS

(71) Applicant: LEDVANCE GmbH, Garching bei Munich (DE)

(72) Inventors: Bernhard Rieder, Regensburg (DE); Christoph Strauß, Regensburg (DE); Florian Wagner, Regensburg (DE); Xiongqiang He, Guangdong (CN)

(73) Assignee: LEDVANCE GMBH, Garching Bei Munich (DE)

( * ) Notice: Subject to any disclaimer, the term of this patent is extended or adjusted under 35 U.S.C. 154(b) by 0 days.

(21) Appl. No.: 15/973,922

(22) Filed: May 8, 2018

(65) Prior Publication Data

US 2018/0320832 A1 Nov. 8, 2018

(30) Foreign Application Priority Data

May 8, 2017 (DE) ........................ 10 2017 109 853

(51) Int. Cl.
| | |
|---|---|
| *H01J 1/62* | (2006.01) |
| *F21K 9/278* | (2016.01) |
| *H05K 1/18* | (2006.01) |
| *H05K 1/02* | (2006.01) |
| *H05B 33/08* | (2006.01) |
| *F21K 9/27* | (2016.01) |
| *F21Y 103/10* | (2016.01) |
| *F21Y 115/10* | (2016.01) |

(52) U.S. Cl.
CPC ............... *F21K 9/278* (2016.08); *F21K 9/27* (2016.08); *H05B 33/0806* (2013.01); *H05K 1/0296* (2013.01); *H05K 1/181* (2013.01); *F21Y 2103/10* (2016.08); *F21Y 2115/10* (2016.08); *H05K 2201/09063* (2013.01); *H05K 2201/09227* (2013.01); *H05K 2201/09236* (2013.01); *H05K 2201/09709* (2013.01); *H05K 2201/10022* (2013.01); *H05K 2201/10106* (2013.01); *H05K 2201/10522* (2013.01); *H05K 2201/10651* (2013.01)

(58) Field of Classification Search
None
See application file for complete search history.

(56) References Cited

U.S. PATENT DOCUMENTS

2013/0113002 A1* 5/2013 Radermacher ............ F21K 9/00
257/88

FOREIGN PATENT DOCUMENTS

| WO | 2012009838 A1 | 1/2012 |
| WO | 2012009839 A1 | 1/2012 |
| WO | 2012009840 A1 | 1/2012 |

(Continued)

*Primary Examiner* — Vip Patel
(74) *Attorney, Agent, or Firm* — Hayes Soloway PC

(57) ABSTRACT

A light engine for a tube lamp has a substrate defining a longitudinal direction, having at least three conductive traces extending in the longitudinal direction. At least two of the conductive traces are divided into a plurality of trace sections. The light engine further includes a plurality of semiconductor light emitting elements, each light emitting element having two electric terminals and being arranged perpendicular to the longitudinal direction and electrically connected with a first electric terminal to one of the conductive traces and with a second electric terminal to another one of the conductive traces.

11 Claims, 4 Drawing Sheets

(56) References Cited

FOREIGN PATENT DOCUMENTS

| WO | 2012009841 A1 | 1/2012 |
| WO | 2012009842 A1 | 1/2012 |

\* cited by examiner

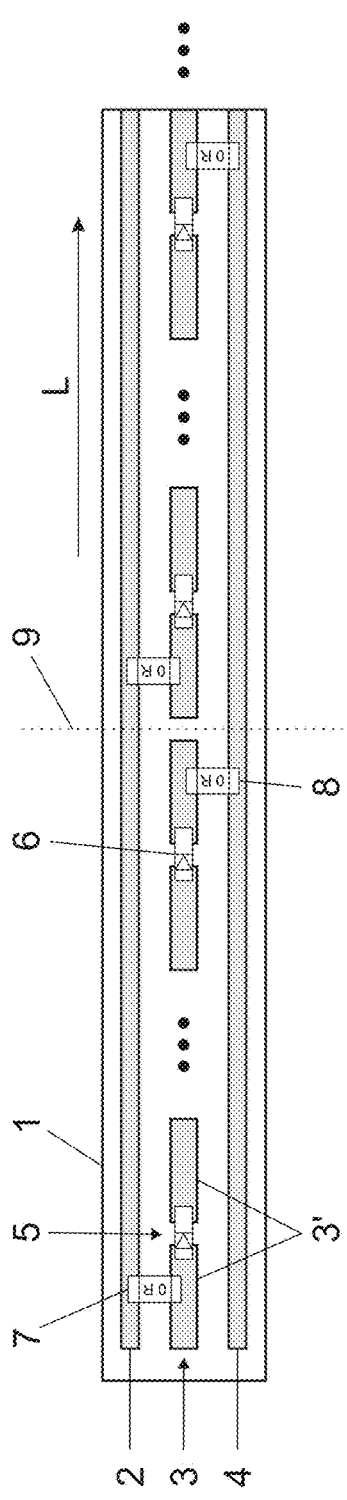
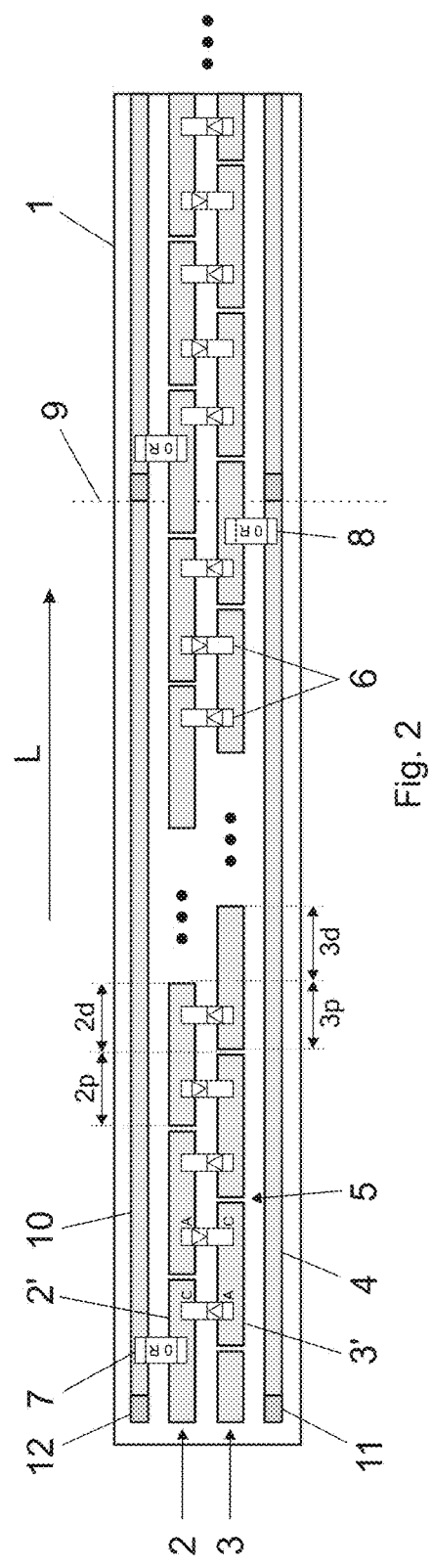
Fig. 1
Fig. 2

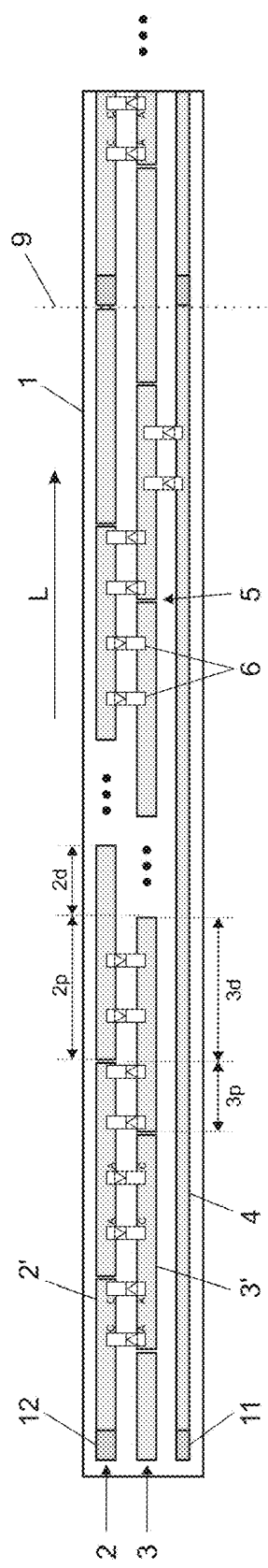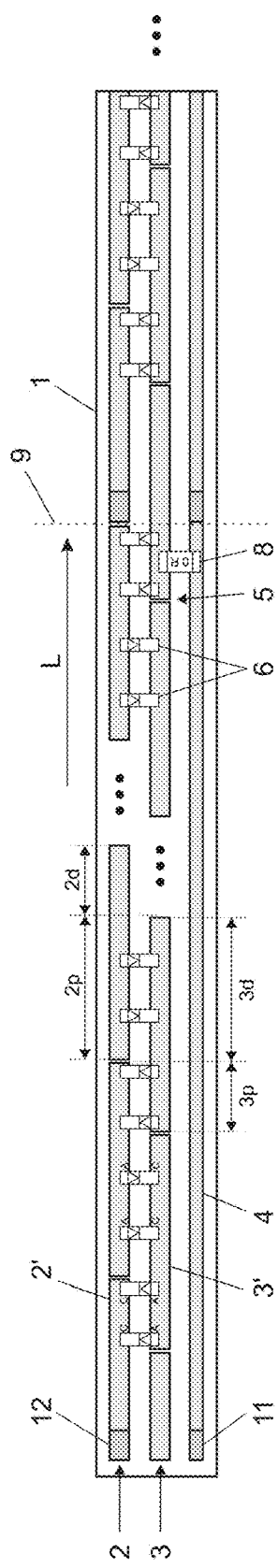

US 10,288,231 B2

NON-ETCHED WIRING BOARD FOR LED APPLICATIONS

CROSS-REFERENCE TO RELATED APPLICATIONS AND PRIORITY

This patent application claims priority from German Patent Application No. 102017109853.4 filed May 8, 2017, which is herein incorporated by reference in its entirety.

TECHNICAL FIELD

The present invention relates to tube lamps based on semiconductor light sources, in particular to retrofit tube lamps for replacing fluorescent tube lamps such as T5 and T8 fluorescent tube lamps.

BACKGROUND

Fluorescent tube lamp are being more and more replaced by retrofit tube lamps employing semiconductor light emitting elements (light emitting diodes, LEDs). Such retrofit lamps usually comprise a housing which is at least partially translucent or transparent, a light engine comprising a plurality of LEDs and an electronic driver for driving the LEDs such that they emit light.

The term "light engine" is commonly used for the assembly comprising the LEDs and a mechanical structure holding the LEDs and including conductive traces and/or wires for supplying the LEDs with electric power from the driver.

Many LED retrofit tube lamps include a light engine having a printed circuit board (PCB) onto which the LEDs are mounted, for example soldered. Such PCBs often are etched from copper sheets laminated onto a non-conductive substrate, resulting in a high consumption of copper and in high material and process costs.

An alternative to printed circuit boards are flexible circuit board as disclosed in international patent applications WO 2012/009838 A1, WO 2012/009839 A1, WO 2012/009840 A1, WO 2012/009841 A1, and WO 2012/009842 A1, the contents of which are incorporated herein in their entirety. These flexible circuit boards are called "wiring boards" by the applicant of these patent applications. This term will be used in the following. Wiring boards are produced by laminating strips of conductive material (e.g. aluminum, made for example by rolling a round wire into a flat strip) between flexible isolating sheets (e.g. polyimide). The circuit design is then obtained by punching holes into the laminate at predetermined positions, thus separating the conductive strips into a plurality of strip elements. Electronic components can then be connected to the strip elements. Preferably, the upper isolating sheet comprises openings where the underlying metal strip is accessible.

The wiring board is flexible and can be wound on reels. It can be cut to a desired length before or after the electronic components have been placed on and fixed to the substrate.

A known light engine for retrofit tube lamps is shown in FIG. 1 and employs a substrate 1 having two conductive traces 2, 4 running continuously along the longitudinal direction L. "Longitudinal direction" here and in the following means the direction in which the substrate (etched PCB, wiring board, or other) has its largest extension, also known as length. The length of a substrate for a retrofit tube lamp is usually less than approximately 550 mm for a tube lamp having an overall length of 590 mm (also called a 2-feet lamp), less than approximately 1160 mm for a tube lamp having an overall length of 1200 mm (also called a 4-feet lamp), and less than approximately 1460 mm for a tube lamp having an overall length of 1500 mm (also called a 5-feet lamp), leaving enough room for an electronic driver.

The other two perpendicular extensions are the width and the thickness of the substrate. The width of the substrate for the example shown in FIG. 1 is usually approximately 7 mm. The thickness of the substrate depends on the production method and can be between approximately 0.05 mm and 0.5 mm (for example between approximately 0.1 mm and 0.3 mm for some wiring boards, between approximately 0.07 mm and 0.3 mm for some etched PCBs).

The two continuous conductive traces 2, 4 may by electrically connected to the outputs of the electronic driver, thus supplying the operating voltage along the length of the light engine. The known light engine further has a third conductive trace 3 running along the longitudinal direction and arranged between the aforementioned conductive traces 2, 4. The third conductive trace 3 is divided into a plurality of trace sections 3' (e.g. by etching or punching) such that the trace sections 3' are arranged one after the other in the longitudinal direction and are electrically isolated from each other (as long as no electronic components are attached) by gaps 5 (also called "separations" in the following).

LEDs 6 are arranged on the substrate such that each LED 6 bridges a gap 5 between two adjacent trace sections 3'. Each LED 6 is electrically connected (e.g. soldered) with its anode to one trace section 3' and with its cathode to the next (in the longitudinal direction) adjacent trace section 3'. Thus, the LEDs 6 are electrically connected in series. A zero-ohm resistor 7 (i.e., an electrically conductive element having negligible electrical resistance) connects the first continuous conductive trace 2 used for power supply to the first trace section 3' of the LED series circuit. Another zero-ohm resistor 8 connects the second continuous conductive trace 4 used for power supply to the last trace section of the LED series circuit.

This pattern can be repeated on the substrate 1 and the substrate 1 can be cut along the potential cut line 9 to obtain a light engine having a specific length. Due to the series connection of the LEDs 6, the distance between to potential cut lines 9 is rather large which makes the design inflexible and difficult to use for different lamp lengths.

Furthermore, arranging the LEDs along the longitudinal direction causes enhanced stress on the soldering joints when the light engine is being moved (which happens easily during assembly of a lamp using the light engine).

SUMMARY OF THE INVENTION

In view of the known prior art, it is an object of the present invention to provide a light engine for a tube lamp which overcomes these problems. It is, in particular, an object to provide a design for a light engine which allows light engines for tube lamps with different lengths to be easily produced.

This object is solved by a light engine and a tube lamp according to the independent claims. Preferred embodiments are given by the dependent claims.

The present invention provides a light engine for a tube lamp, in particular a semiconductor (e.g. LED) retrofit tube lamp. The light engine comprises a substrate defining a longitudinal direction (see above for the definition of "longitudinal direction"). At least three conductive traces extending in the longitudinal direction are arranged on the substrate. The substrate with the conductive traces can be produced as PCB (etching, milling, etc.), wiring board, or with any other known method. The substrate can be rigid (e.g. etched PCB) or flexible (e.g. punched wiring board).

At least two of the conductive traces are divided into a plurality of trace sections. The trace sections corresponding to each of the conductive traces are arranged one after the other in the longitudinal direction and are electrically isolated from each other (as long as no electronic components are attached). For each of the conductive traces which are divided into trace sections, adjacent trace sections are separated from each other by a gap or separation. Preferably, the conductive traces which are divided into a plurality of trace sections are neighboring conductive traces, i.e., they are arranged next to each other (seen perpendicular to the longitudinal direction) with a separating distance between them, but without another conductive trace arranged between them.

The light engine further comprises a plurality of semiconductor light emitting elements (e.g. LEDs), each light emitting element having two electric terminals. Each of the light emitting elements is arranged perpendicular to the longitudinal direction, i.e., such that the direction from one electric terminal to the other electric terminal is perpendicular to the longitudinal direction. Each of the light emitting elements is electrically connected with a first electric terminal to one of the conductive traces and with a second electric terminal to another one of the conductive traces. In particular, each of the light emitting elements is electrically connected with a first electric terminal to a trace section of one of the conductive traces and with a second electric terminal to a trace section of another one of the conductive traces. A light emitting element can also be electrically connected with a first electric terminal to a trace section of one of the conductive traces divided into trace sections and with a second electric terminal to a conductive trace which is not divided into trace sections.

Dividing two or more conductive traces into trace sections facilitates a flexible design of the light engine, allowing potential cut lines to be closer to each other than in the prior art. Thus, the same design of the substrate of the light engine may be used for tube lamps having different lengths. Arranging the light emitting elements perpendicular to the longitudinal direction allows for even smaller independent sections, bringing the potential cut lines even closer together. It also reduces the stress on the solder joints when the light engine is moved during assembly of the tube lamp. This is of particular importance when the substrate is flexible, such as for wiring boards.

In a preferred embodiment a first conductive trace is divided into a plurality of trace sections at a first set of longitudinal positions and a second conductive trace is divided into a plurality of trace sections at a second set of longitudinal positions. "Longitudinal position" of a specific point means the distance of the specific point from a reference point (e.g. one end of the substrate) in the longitudinal direction.

The longitudinal positions of the first set are different from the longitudinal positions of the second set. Preferably, all longitudinal positions of the first set are different from the longitudinal positions of the second set. In other words, the two conductive traces are divided into trace sections such that at each longitudinal position only one of the conductive traces has a gap between two trace sections. It is also possible, that only some longitudinal positions of the first set are different from the longitudinal positions of the second set, i.e., that at some longitudinal positions both conductive traces have a gap between two trace sections.

In a further preferred embodiment each trace section comprises a proximal portion and a distal portion. Herein, "proximal" is understood to mean the direction towards the end of the light engine where the light engine is configured to be connected to an electronic driver ("driver end") and "distal" is understood to mean the direction away from the end of the light engine where the light engine is configured to be connected to an electronic driver. The proximal portion of a trace section, therefore, is the portion of the trace section closer to the driver end, whereas the distal portion of a trace section is the portion of the trace section further away from the driver end. Proximal and distal portion of a trace section are electrically connected to each other. The distinction between proximal and distal portion may be fully imaginary without any physical structure distinguishing proximal and distal portion.

In this preferred embodiment, each of the light emitting elements is electrically connected with a first electric terminal to the proximal portion of a trace section of one of the conductive traces and with a second electric terminal to the distal portion of a trace section of another one of the conductive traces. In other words, the gaps between the trace sections of one conductive trace are located at different longitudinal positions than the gaps between the trace sections of the other conductive trace (similar to the embodiment discussed above), such that a distal portion of a trace section of one conductive trace is arranged next to (seen perpendicular to the longitudinal direction, in the direction of the width of the substrate) a proximal portion of a trace section of the other conductive trace.

This configuration allows for a particular efficient design of the light engine.

In a further preferred embodiment the light emitting elements are arranged in groups of electrically parallel light emitting elements. The groups of electrically parallel light emitting elements may be arranged in an electrically serial manner. In other words, the light engine may comprise a series connection of groups of light emitting elements, wherein each group comprises a parallel connection of light emitting elements. Preferably, each group comprises the same number of light emitting elements. Each group may comprise 2, 3, 4, or more light emitting elements.

Using groups of electrically parallel light emitting elements may further simplify the design of the light engine and allow specific desired operating voltages to be reached.

It is a preferred embodiment that the light emitting elements are arranged in groups of electrically parallel light emitting elements and that each trace section comprises a proximal portion and a distal portion, wherein the light emitting elements of each group are electrically connected with their respective first electric terminals to the proximal portion of a trace section of one of the conductive traces and with their respective second electric terminals to the distal portion of a trace section of another one of the conductive traces.

This configuration is similar to the one described above where each of the light emitting elements is electrically connected with a first electric terminal to the proximal portion of a trace section of one of the conductive traces and with a second electric terminal to the distal portion of a trace section of another one of the conductive traces. Details discussed above may apply here as well.

In a further preferred embodiment the trace sections of the divided conductive traces, apart from the respective first and last trace section of the divided conductive traces, have the same length. This simplifies production of the substrate with the conductive traces by a punching process (e.g. wiring board), since the punching tool which defines the lengths of the trace section can be kept short (thus reducing costs) and used multiple times.

In a further preferred embodiment the ratio of the distance of a gap between two trace sections of a first conductive trace from the neighboring gap in proximal direction between two trace sections of a second conductive trace to the distance of the gap between two trace sections of the first conductive trace from the neighboring gap in distal direction between two trace sections of the second conductive trace is approximately between ⅓ and 3, preferably approximately between ½ and 2. In another embodiment, said ratio can be 1.

In other words, the above values are the ratio between the proximal portion of a trace section of a first conductive trace which is arranged next to a distal portion of a trace section of a second conductive trace and the distal portion of the same trace section of the first conductive trace which is arranged next to a proximal portion of the next trace section of the second conductive trace.

In a further preferred embodiment the trace sections of a conductive trace are separated from each other by punched holes. Obtaining the desired design of the trace section by punching holes in a substrate with conductive traces (see above for the wiring board process) facilitates an easy and comparatively cheap production of the light engine and also allows the production process to be adapted rather easily to another design by varying the punching elements of the punching tool.

In a further preferred embodiment one of the conductive traces has a width that is smaller than, preferably half of, the width of the other conductive traces. Reducing the width of the conductive traces allows a reduction of the width of the light engine, thus saving material and costs.

In a further preferred embodiment the light engine further comprises at least one zero-ohm resistor arranged perpendicular to the longitudinal direction and electrically connected with a first electric terminal to one of the conductive traces and with a second electric terminal to another one of the conductive traces. Using zero-ohm resistors allows making an electric connection between neighboring conductive traces and/or trace sections, in particular in cases where the required number of light emitting elements has already been reached.

The present invention furthermore relates to a tube lamp comprising a light engine as discussed above.

The tube lamp may further comprise a housing which is translucent and/or transparent at least in parts, a heat spreading device, an electronic driver electrically connected to the light engine, connection terminals mechanically connected to the housing and electrically connected to the driver for supplying the driver with electric power.

The tube lamp can be a retrofit T5 or T8 tube lamp or any other size tube lamp.

BRIEF DESCRIPTION OF THE DRAWINGS

Preferred embodiments of the invention will be explained in the following, having regard to the drawings. It is shown in:

FIG. 1 a schematic partial view of a prior art embodiment of a light engine for a retrofit tube lamp;
FIG. 2 a schematic partial view of a first embodiment of a light engine according to the present invention;
FIG. 3 a schematic partial view of a second embodiment of a light engine according to the present invention;
FIG. 4 a schematic partial view of a third embodiment of a light engine according to the present invention.

DETAILED DESCRIPTION OF THE INVENTION

Figure 5:
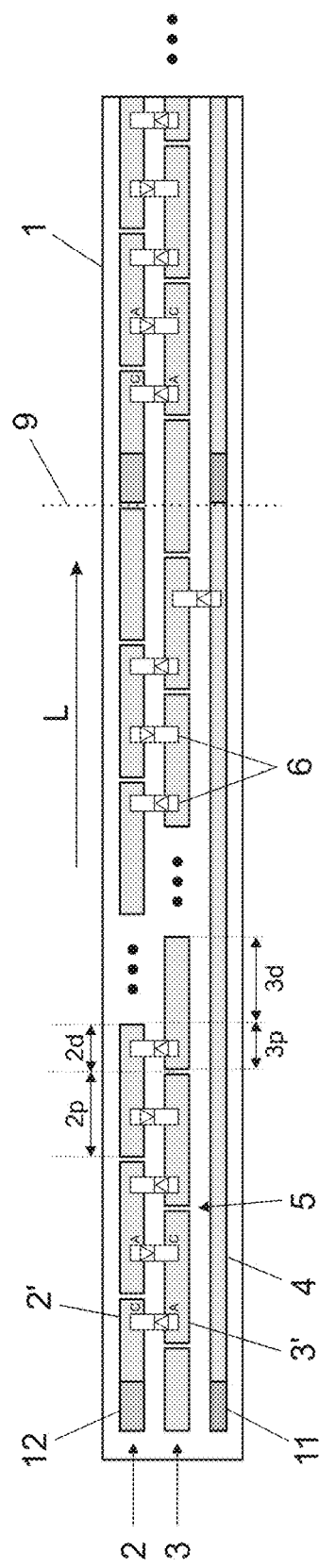
FIG. 5 a schematic partial view of a forth embodiment of a light engine according to the present invention.

In the following, preferred embodiments of the invention will be described with reference to the drawings. The same or similar elements or elements having the same effect may be indicated by the same reference number in multiple drawings. Repeating the description of such elements may be omitted in order to prevent redundant descriptions.

FIG. 2 shows a schematic partial view of a first embodiment of a light engine. The light engine employs a substrate 1 having two conductive traces 4, 10 running continuously along the longitudinal direction L. These continuous conductive traces 4, 10 are adapted to be connected to an electronic driver via driver connection terminals 11, 12. Two further conductive traces 2, 3 are arranged on the substrate 1 between the continuous conductive traces 4, 10. The further conductive traces 2, 3 are each divided into trace sections 2', 3'. The trace sections 2', 3' of each conductive trace 2, 3 are separated from each other by gaps 5 which are produced either by etching or by punching.

The gaps 5 are arranged such that the distal portion 2d of each trace section 2' of the corresponding conductive trace 2 is located next to a proximal portion 3p of a trace section 3' of the corresponding trace 3 (apart from the first trace sections of each conductive trace 2, 3 next to the driver terminals 11, 12). In the embodiment shown in FIG. 2 the proximal portion 2p, 3p and the distal portion 2d, 3d of each trace section 2', 3' have approximately the same length, i.e., the ratio of the length of a proximal portion 2p, 3p to the length of a distal portion 2d, 3d is approximately 1. In other embodiments, this ratio can be ⅓, ½, 2, 3 or any other suitable number.

A plurality of LEDs 6 is arranged on the substrate such that each LED 6 is arranged perpendicular to the longitudinal direction. Each LED 6 is electrically connected (e.g. by soldering) with its cathode C to the distal portion 2d, 3d of a trace section 2', 3' and with its anode A to the proximal portion 2p, 3p of a neighboring trace section 2', 3'. Thus, each trace section 2', 3' is electrically connected to the anode A of a first LED 6 and to the cathode C of a second LED 6. This results in a series connection of the plurality of LEDs 6.

Depending on the driver concept, more than one such series connection may be required. For a 4-feet tube lamp (length approximately 1200 mm) currently about 66 LEDs are required, for a 5-feet tube lamp (length approximately 1500 mm) currently about 80 LEDs are required. Assuming an operating voltage of about 3 V for each LED, this results in a total operating voltage of about 198 V or 240 V, respectively. Such a voltage can be obtained using a linear driver.

If a switch mode driver (e.g. a buck driver) is to be used, the optimal total operating voltage is around 100 V. In that case, two series connections of 33 or 40 LED, respectively, must be used in a parallel connection.

The continuous conductive traces 4, 10 thus serve to provide the first as well as the second series connection with the operating voltage. Zero-ohm resistors 7, 8 are used to connect the respective first and last trace section of each series connection to the continuous conductive traces.

Using four conductive traces results in a width of the light engine of approximately 10 mm. In order to keep the width as small as possible, the two continuous conductive traces 4, 10 can have a width smaller than the width of the inner two conductive traces 2, 3, since only zero-ohm resistors 7, 8 having smaller connection terminals than the LEDs 4 are connected to the continuous outer traces 4, 10.

Nevertheless, it would be desirable to further decrease the width of the light engine.

This can be achieved, for example, with the light engine shown schematically in FIG. 3. The light engine employs a substrate 1 having a conductive trace 4 running continuously along the longitudinal direction L. This continuous conductive trace 4 is adapted to be connected to an electronic driver via driver connection terminal 11. Two further conductive traces 2, 3 are arranged on the substrate 1, with an inner conductive trace 3 next to the continuous conductive trace 4 and an outer conductive trace 2 next to the inner conductive trace 3. The further conductive traces 2, 3 are each divided into trace sections 2', 3'. The trace sections 2', 3' of each conductive trace 2, 3 are separated from each other by gaps 5 which are produced either by etching or by punching. The proximal-most trace section of the outer trace 2 is adapted to be connected to an electronic driver via driver connection terminal 12.

The gaps 5 are arranged such that the distal portion 2d of each trace section 2' of the corresponding conductive trace 2 is located next to a proximal portion 3p of a trace section 3' of the corresponding trace 3 (apart from the first trace sections of each conductive trace 2, 3 next to or including the driver terminals 11, 12). In the embodiment shown in FIG. 3 the proximal portion 3p of each trace section 3' of the inner conductive trace 3 has approximately a length which is half the length of the distal portion 3d of the same trace section 3', i.e., the ratio of the length of a proximal portion 3p to the length of a distal portion 3d is approximately ½. In other embodiments, this ratio can be ⅓, 1, 2, 3 or any other suitable number. For the outer conductive trace 2, this ratio is the inverse value, i.e. the proximal portion 2p of each trace section 2' of the outer conductive trace 2 has approximately a length which is twice the length of the distal portion 2d of the same trace section 2'. Thus, the ratio of the length of a proximal portion 2p to the length of a distal portion 2d is approximately 2. In other embodiments, this ratio can be 3, 1, ½, ⅓ or any other suitable number.

Such a substrate with conductive traces is translationally invariant after a translation in the longitudinal direction of an amount corresponding to the distance k of two gaps on one of the divided conductive traces (i.e., approximately the length of a trace section). This allows an efficient manufacturing of the substrate, in particular for producing light engines of different lengths.

A plurality of LEDs 6 is arranged on the substrate such that each LED 6 is arranged perpendicular to the longitudinal direction. Each LED is electrically connected (e.g. by soldering) with its cathode C to the distal portion 2d, 3d of a trace section 2', 3' and with its anode A to the proximal portion 2p, 3p of a neighboring trace section 2', 3'. Two LEDs 6 are connected to each distal and proximal section, such that the two LEDs are electrically parallel. Thus, each trace section 2', 3' is electrically connected to the anodes A of two first LEDs 6 and to the cathodes C of two second LEDs 6. This results in a series connection of groups of LEDs, wherein each group comprises two LEDs 6 in a parallel connection.

The connection from the last (distal-most) trace section of the inner conductive trace 3 to the continuous conductive trace 4 is achieved by connecting the cathodes C of two LEDs 6' to the trace section and the anodes A of the two LEDs 6' to the continuous conductive trace 4. Since the anode terminal of SMD LEDs usually is smaller than the cathode terminal, the width of the continuous conductive trace 4 can be smaller than the width of the other two conductive traces 2, 3, thus allowing to reduce the width of the light engine even further.

An alternative for the connection from the last (distal-most) trace section of the inner conductive trace 3 to the continuous conductive trace 4 is shown in FIG. 4 which depicts a schematic partial view of a third embodiment of a light engine. In this embodiment, a zero-ohm resistor 8 is connected with one terminal to the distal-most trace section and with the other terminal to the continuous conductive trace 4.

Apart from replacing the last group of LEDs 6' with a zero-ohm resistor 8, the second embodiment (FIG. 3) and the third embodiment (FIG. 4) are essentially the same.

As has been mentioned above, the design of the substrate with the conductive traces of FIG. 3 and FIG. 4 is translationally invariant under a longitudinal translation by the length k (distance of two gaps on one of the divided conductive traces). Accordingly, the substrate 1 can be cut after each distance k (i.e., at longitudinal positions n·k, wherein n is a positive integer number, n=1, 2, 3, . . . ) at the indicated potential cut lines 9. In the embodiment of FIG. 3, cutting the substrate at a potential cut line 9 results in the distal portion of the last section being without electronic components. This empty portion may be removed. Alternatively, the substrate may be cut at longitudinal position (n+0.5)k and the start of the substrate for the next light engine shortened correspondingly.

Typically, for retrofit LED tube lamps, the pitch p of the LEDs, i.e. the distance between the centers of two consecutive LEDs, is about 16.9 mm. In the embodiments of FIG. 3 and FIG. 4, four LEDs must fit on each trace section. Accordingly, k=4p=67.6 mm.

A light engine for a 5-feet tube lamp (length approximately 1500 mm) may comprise 21.5 segments (as shown in FIG. 3) with a length of k=67.6 mm each, i.e. a total length of about 1453 mm (leaving enough room for a driver which usually requires about 40 to 50 mm in the longitudinal direction). This results in 84 LEDs (2 LEDs on the first segment, 20 segments with 4 LEDs each, and 2 LEDs on the last segment, connecting the inner conductive trace to the continuous conductive trace) and, thus, a total operating voltage of about 126 V due to the parallel connection of the LEDs.

Alternatively, the pitch p could be reduced to 16.4 mm, thus resulting in k=65.6 mm. A light engine for a 5-feet tube lamp (length approximately 1500 mm) may then comprise 22 segments (as shown in FIG. 4), i.e. a total length of about 1443 mm (again leaving enough room for a driver). This results in 86 LEDs (2 LEDs on the first segment, 21 segments with 4 LEDs each, a zero-ohm resistor connecting the distal-most trace section of the inner conductive trace to the continuous conductive trace) and, thus, a total operating voltage of about 129 V due to the parallel connection of the LEDs.

Using the reduced pitch of p=16.4 mm, a light engine for a 4-feet tube lamp (length approximately 1200 mm) may comprise 17.5 segments (as shown in FIG. 3) with a length of k=65.6 mm each, i.e. a total length of about 1148 mm (again leaving enough room for a driver). This results in 68 LEDs (2 LEDs on the first segment, 16 segments with 4 LEDs each, and 2 LEDs on the last segment, connecting the inner conductive trace to the continuous conductive trace) and, thus, a total operating voltage of about 102 V due to the parallel connection of the LEDs.

With the larger pitch p=16.9 mm, a light engine for a 4-feet tube lamp (length approximately 1200 mm) may comprise 17 segments (as shown in FIG. 4) with a length of k=67.6 mm each, i.e. a total length of about 1149 mm (again leaving enough room for a driver). This results in 66 LEDs (2 LEDs on the first segment, 16 segments with 4 LEDs each, a zero-ohm resistor connecting the distal-most trace section of the inner conductive trace to the continuous conductive trace) and, thus, a total operating voltage of about 99 V due to the parallel connection of the LEDs.

Using the reduced pitch of p=16.4 mm, a light engine for a 2-feet tube lamp (length approximately 590 mm) may comprise 8.5 segments (as shown in FIG. 3) with a length of k=65.6 mm each, i.e. a total length of about 557 mm (again leaving enough room for a driver). This results in 32 LEDs (2 LEDs on the first segment, 7 segments with 4 LEDs each, and 2 LEDs on the last segment, connecting the inner conductive trace to the continuous conductive trace) and, thus, a total operating voltage of about 48 V due to the parallel connection of the LEDs.

With the larger pitch p=16.9 mm, a light engine for a 2-feet tube lamp (length approximately 590 mm) may comprise 8 segments (as shown in FIG. 4) with a length of k=67.6 mm each, i.e. a total length of about 540 mm (again leaving enough room for a driver). This results in 30 LEDs (2 LEDs on the first segment, 7 segments with 4 LEDs each, a zero-ohm resistor connecting the distal-most trace section of the inner conductive trace to the continuous conductive trace) and, thus, a total operating voltage of about 45 V due to the parallel connection of the LEDs.

The total operating voltages of the above examples can easily be obtained using a switch mode driver.

As can be seen from these examples (which are illustrative only and are not to be considered limiting) the present invention allows light engines for tube lamps having different lengths to be produced from the same substrate, thus simplifying production.

As has been explained above, in the embodiments shown in FIG. 3 and FIG. 4 each proximal portion $3p$ has approximately a length which is half the length of the distal portion $3d$ of each trace section 3', i.e., the ratio of the length of a proximal portion $3p$ to the length of a distal portion $3d$ is approximately ⅓ to ⅔ or approximately ½ (and the inverse value 2 for the outer conductive trace 2). This ratio is particularly advantageous, since it allows to easily modify the stamping tool for a wiring board process by inserting additional stamping elements, each in the middle between two existing stamping elements. Using such a modified stamping tool, it is possible to produce a wiring board wherein the length of each trace section is half of the length of the trace sections of the previously discussed embodiments while maintaining the partially overlapping arrangement of the trace sections.

It should be noted that other manufacturing methods may be used for producing a substrate with conductive traces having such smaller trace section, for example etching, milling, etc.

Such a wiring board can be used for a light engine with a single series connection of LEDs as shown in the schematic view of another embodiment in FIG. 5. A plurality of LEDs 6 is arranged on the substrate such that each LED 6 is arranged perpendicular to the longitudinal direction. Each LED is electrically connected (e.g. by soldering) with its cathode C to the distal portion $2d$, $3d$ of a trace section 2', 3' and with its anode A to the proximal portion $2p$, $3p$ of a neighboring trace section 2', 3'. Only one LED 6 is connected to each distal and proximal section. Thus, each trace section 2', 3' is electrically connected to the anode A of a first LED 6 and to the cathode C of a second LED 6. This results in a series connection of the LEDs 6.

In this embodiment, using an LED pitch of p=16.9 mm, each section has a length of k=2p=33.8 mm. A light engine for a 2-feet tube lamp (length approximately 590 mm) may comprise 16 segments, i.e. a total length of about 541 mm (again leaving enough room for a driver). This results in 31 LEDs (1 LED on the first segment, 15 segments with 2 LEDs each, a zero-ohm resistor connecting the distal-most trace section of the inner conductive trace to the continuous conductive trace) and, thus, a total operating voltage of about 93 V.

Using an LED pitch of p=16.4 mm, a light engine for a 2-feet tube lamp (length approximately 590 mm) may comprise 16.5 segments each having a length of k=2p=32.8 mm, i.e. a total length of about 541 mm (again leaving enough room for a driver). This results in 32 LEDs (1 LED on the first segment, 15 segments with 2 LEDs each, and 1 LED on the last segment, connecting the inner conductive trace to the continuous conductive trace) and, thus, a total operating voltage of about 96 V. This embodiment is schematically shown in FIG. 5.

These (illustrative and non-limiting) examples again demonstrate the flexibility brought forth by the present invention.

Figure 6:
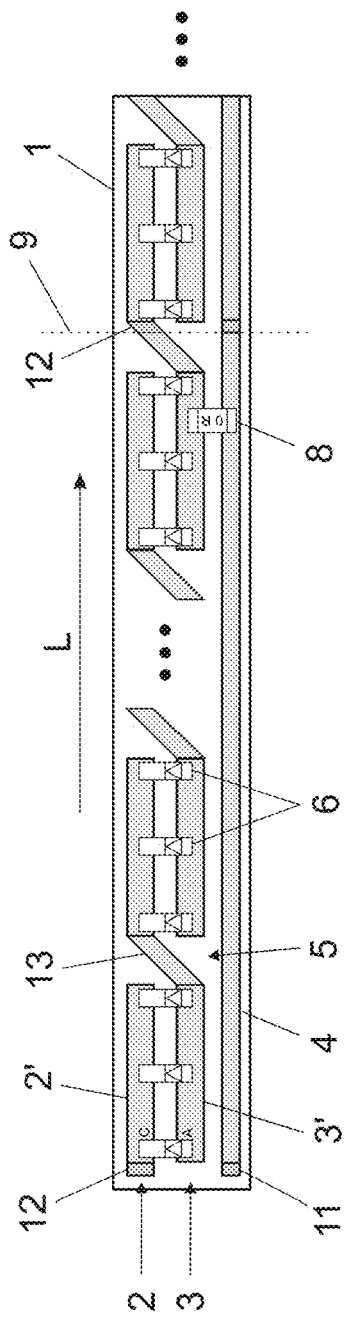
FIG. 6 a schematic partial view of a fifth embodiment of a light engine according to the present invention.

FIG. 6 shows a schematic partial view of another embodiment of a light engine. The light engine employs a substrate 1 having a conductive trace 4 running continuously along the longitudinal direction L. This continuous conductive trace 4 is adapted to be connected to an electronic driver via driver connection terminal 11. Two further conductive traces 2, 3 are arranged on the substrate 1, with an inner conductive trace 3 next to the continuous conductive trace 4 and an outer conductive trace 2 next to the inner conductive trace 3. The further conductive traces 2, 3 are each divided into trace sections 2', 3'. The trace sections 2', 3' of each conductive trace 2, 3 are separated from each other by gaps 5. The proximal-most trace section of the outer trace 2 is adapted to be connected to an electronic driver via driver connection terminal 12.

Contrary to the previous embodiments, gaps 5 between two consecutive trace sections 2' of the outer conductive trace 2 and between two consecutive trace sections 3' of the inner conductive trace 3 are located at the same longitudinal positions. The gaps 5 are bridged by connecting trace sections 13, connecting the distal end of each trace section 3' of the inner conductive trace 3 with the proximal end of the next (in the longitudinal directions) trace section 2' of the outer conductive trace 2. The connecting trace sections may run obliquely as shown in FIG. 6. Alternatively, the connecting trace sections may run partially in the longitudinal direction and partially perpendicular to the longitudinal direction. A portion of a connecting trace section may serve as driver connection terminal 12.

Such a substrate with conductive traces is translationally invariant after a translation in the longitudinal direction of an amount corresponding to the distance k of two gaps on one of the divided conductive traces (i.e., approximately the length of a trace section). This allows an efficient manufacturing of the substrate, in particular for producing light engine of different lengths.

A plurality of LEDs 6 is arranged on the substrate such that each LED 6 is arranged perpendicular to the longitudinal direction. Each LED is electrically connected (e.g. by soldering) with its cathode C to a trace section 2' of the outer conductive trace 2 and with its anode A to a neighboring trace section 3' of the inner conductive trace. Three LEDs 6 are connected to each trace section 2', 3', such that the three LEDs are electrically parallel. Since each trace section 3' of the inner conductive trace 3 is electrically connected to the next trace section 2' of the outer conductive trace 2, this results in a series connection of groups of LEDs, wherein each group comprises three LEDs 6 in a parallel connection.

The last (distal-most) trace section 3' of the inner conductive trace 3 is electrically connected to the continuous conductive trace 4 by means of a zero-ohm resistor 8 which is connected with one terminal to the distal-most trace section 3' and with the other terminal to the continuous conductive trace 4.

While FIG. 6 shows an embodiment using groups of three LEDs 6 in a parallel connection, the groups of LEDs 6 may also comprise any other number, for example 2, 4, or 5 LEDs. The length of the trace sections 2', 3' corresponds essentially to (m−1)p with the m being number of electrically parallel LEDs in each group and p being the LED pitch. The length of the trace sections 2', 3' may also be slightly larger than (m−1)p.

Figure 7:
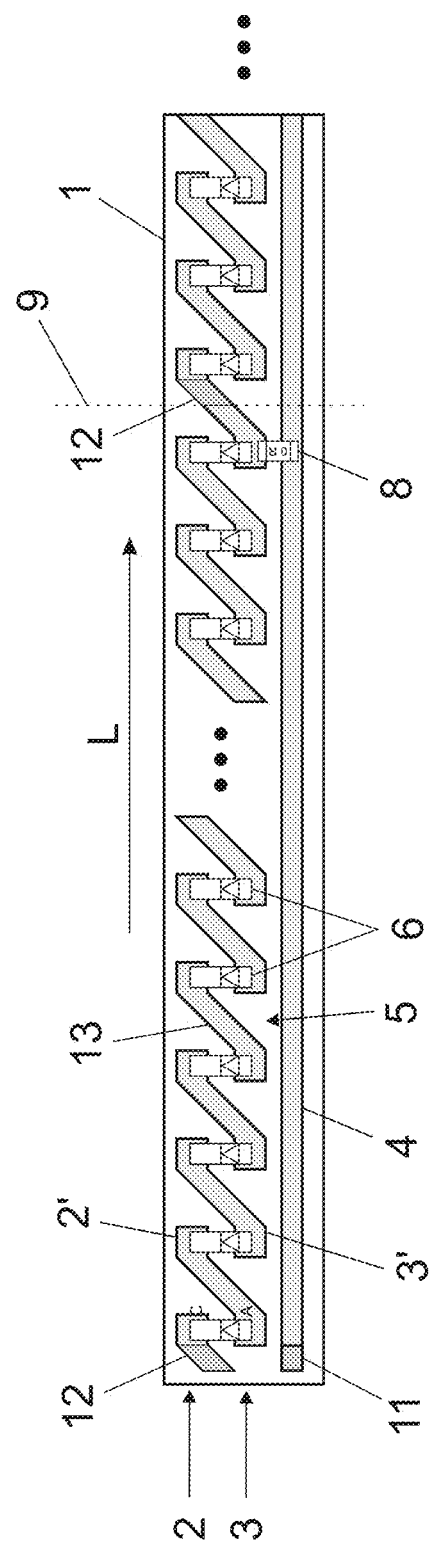
FIG. 7 a schematic partial view of a sixth embodiment of a light engine according to the present invention.

Instead of using groups of electrically parallel LEDs 6, the LEDs 6 may also be connected in series as shown in the embodiment depicted schematically in FIG. 7. Here, the length of the trace sections 2', 3' is such that only one LED 6 is electrically connected (e.g. by soldering) with its cathode C to a trace section 2' of the outer conductive trace 2 and with its anode A to a neighboring trace section 3' of the inner conductive trace.

Again, the last (distal-most) trace section 3' of the inner conductive trace 3 is electrically connected to the continuous conductive trace 4 by means of a zero-ohm resistor 8 which is connected with one terminal to the distal-most trace section 3' and with the other terminal to the continuous conductive trace 4. Alternatively, a further LED may be used which is connected with its cathode to the distal-most trace section 3' and with its anode to the continuous conductive trace 4.

Preferably, the substrate of the light engines shown in FIG. 6 and FIG. 7 is produced by etching, since oblique trace sections cannot be produced by the wiring board process.

In a further embodiment (not shown), the connecting trace sections may be formed by trace sections running in the longitudinal directions which are connected by zero-ohm resistors. In other words, each trace section of the outer conductive trace may have a proximal portion which is arranged neighboring a distal portion of a trace section of the inner conductive trace, said neighboring proximal and distal portions being connected with a zero-ohm resistor. Here, the wiring board process can be used again.

Although the invention has been illustrated and described in detail by the embodiments explained above, it is not limited to these embodiments. Other variations may be derived by the skilled person without leaving the scope of the attached claims.

Generally, "a" or "an" may be understood as singular or plural, in particular with the meaning "at least one", "one or more", etc., unless this is explicitly excluded, for example by the term "exactly one", etc.

In addition, numerical values may include the exact value as well as a usual tolerance interval, unless this is explicitly excluded.

Features shown in the embodiments, in particular in different embodiments, may be combined or substituted without leaving the scope of the invention.

LIST OF REFERENCE NUMERALS 1 substrate
2 conductive trace
2' trace sections of conductive trace 2
2p, 2d proximal/distal portion of a trace section 2'
3 conductive trace
3' trace sections of conductive trace 3
3p, 3d proximal/distal portion of a trace section 3'
4 conductive trace
5 gaps between trace sections
6, 6' light emitting diodes
7, 8 zero-ohm resistors
9 potential cut lines
10 conductive trace
11, 12 driver terminals
13 connecting trace sections
L longitudinal direction

The invention claimed is:

1. A light engine for a tube lamp, comprising
a substrate defining a longitudinal direction, having at least three conductive traces extending in the longitudinal direction,
wherein at least two of the conductive traces are divided into a plurality of trace sections;
a plurality of semiconductor light emitting elements, each of the light emitting element having two electric terminals,
wherein each of the light emitting elements is arranged perpendicular to the longitudinal direction (L) and is electrically connected with a first electric terminal to one of the conductive traces and with a second electric terminal to another one of the conductive traces.

2. The light engine according to claim 1,
wherein a first conductive trace of the conductive traces is divided into a first plurality of trace sections at a first set of longitudinal positions,
wherein a second conductive trace of the conductive traces is divided into a second plurality of trace sections at a second set of longitudinal positions,
wherein the longitudinal positions of the first set are different from the longitudinal positions of the second set.

3. The light engine according to claim 1, wherein each trace section comprises a proximal portion and a distal portion, wherein each of the light emitting elements is electrically connected with a first electric terminal to the proximal portion of the trace section of one of the conductive traces and with a second electric terminal to the distal portion of the trace section of another one of the conductive traces.

4. The light engine according to claim 1,
wherein the light emitting elements are arranged in groups of electrically parallel light emitting elements.

5. The light engine according to claim 4, wherein each trace section comprises a proximal portion and a distal portion, wherein the light emitting elements of each group are electrically connected with their respective first electric terminals to the proximal portion of the trace section of one of the conductive traces and with their respective second electric terminals to the distal portion of a trace section of another one of the conductive traces.

6. The light engine according to claim 1, wherein the trace sections of the divided conductive traces, apart from the respective first and last trace section of the divided conductive traces, each have the same length.

7. The light engine according to claim 6, wherein the ratio of the distance of a gap between two trace sections of a first conductive trace of the conductive traces from a neighboring gap in proximal direction between two trace sections of a second conductive trace of the conductive traces to the distance of the gap between two trace sections of the first conductive trace from the neighboring gap in distal direction between two trace sections of the second conductive trace is approximately between ⅓ and 3.

8. The light engine according to claim 1, wherein the trace sections of a conductive trace are separated from each other by punched holes.

9. The light engine according to claim 1, wherein one of the conductive traces has a width that is smaller than the width of the other conductive traces.

10. The light engine according to claim 1, further comprising at least one zero-ohm resistor arranged perpendicular to the longitudinal direction and electrically connected with a first electric terminal to one of the conductive traces and with a second electric terminal to another one of the conductive traces.

11. A tube lamp comprising the light engine according to claim 1.

* * * * *